(12) United States Patent
Koike

(10) Patent No.: US 7,642,818 B1
(45) Date of Patent: Jan. 5, 2010

(54) HIGH VOLTAGE TOLERANT INPUT CIRCUIT CAPABLE OF OPERATING AT EXTREMELY LOW IO SUPPLY VOLTAGE

(75) Inventor: Hideharu Koike, Yokohama (JP)

(73) Assignee: Winbond Electronics Corp., Taichung County (TW)

( * ) Notice: Subject to any disclaimer, the term of this patent is extended or adjusted under 35 U.S.C. 154(b) by 0 days.

(21) Appl. No.: 12/250,790

(22) Filed: Oct. 14, 2008

(51) Int. Cl.
*H03B 1/00* (2006.01)
(52) U.S. Cl. ...................... 327/108; 327/109
(58) Field of Classification Search ................. 327/108, 327/109, 333, 530, 537
See application file for complete search history.

(56) References Cited
U.S. PATENT DOCUMENTS

| | | | |
|---|---|---|---|
| 6,184,700 B1 * | 2/2001 | Morris | 326/14 |
| 6,400,191 B2 * | 6/2002 | Kawano et al. | 327/112 |
| 6,724,226 B2 | 4/2004 | Kim | |
| 7,388,410 B2 * | 6/2008 | Kim et al. | 327/108 |
| 7,564,287 B2 * | 7/2009 | Chen | 327/310 |

* cited by examiner

*Primary Examiner*—Hai L Nguyen
(74) *Attorney, Agent, or Firm*—J.C. Patents (57) ABSTRACT

An input circuit including a diode, a resistor, a first transistor, a buffer, a bulk voltage generating unit and an enhancing unit is provided. The input circuit of the present invention uses the bulk voltage generating unit and the enhancing unit for making the internal input voltage to be the same as the external input voltage when the external input voltage is less than or equal to the first supply voltage (for example, the IO supply voltage). Moreover, even if the first supply voltage is extremely low, the input circuit of the present can still operate correctly. Accordingly, the input circuit of the present invention can be operated at extremely low IO supply voltage.

29 Claims, 7 Drawing Sheets

HIGH VOLTAGE TOLERANT INPUT CIRCUIT CAPABLE OF OPERATING AT EXTREMELY LOW IO SUPPLY VOLTAGE

BACKGROUND OF THE INVENTION

1. Field of the Invention

The present invention relates to an input circuit, more particularly, the present invention relates to a high voltage tolerant input circuit capable of operating at extremely low input/output (IO) supply voltage.

2. Description of the Related Art

Figure 1:
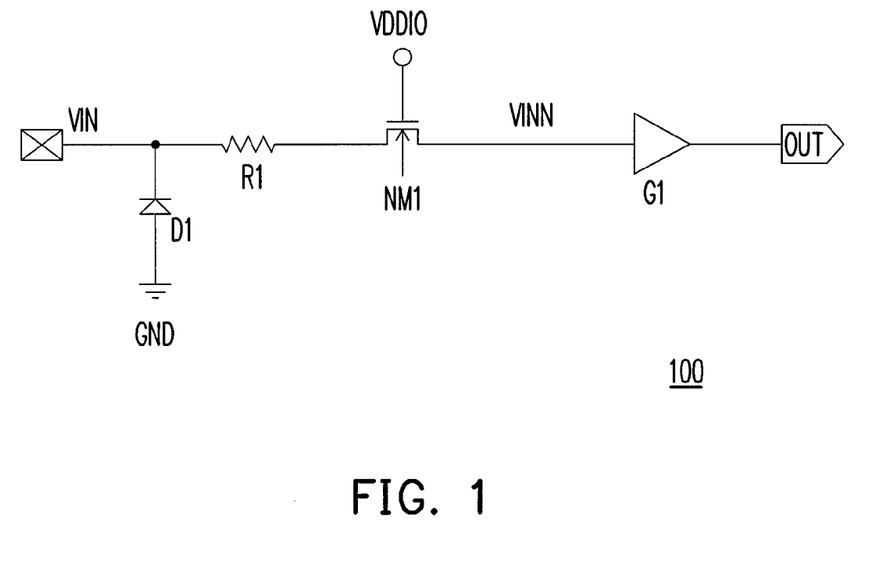
FIG. 1 is a circuit diagram of a conventional high voltage tolerant input circuit.

FIG. 1 is a circuit diagram of a conventional high voltage tolerant input circuit 100. Referring to FIG. 1, the conventional input circuit 100 includes a diode D1, a resistor R1, an NMOS transistor NM1 and a buffer G1. In general, the diode D1 is an electrostatic discharge (ESD) protection device. The resistor R1 is used for protecting the NMOS transistor NM1 and the buffer G1 by adding a delay and reducing the noise level of the external input voltage VIN. A gate terminal of the NMOS transistor NM1 would be biased on an input/output (IO) supply voltage VDDIO, so that the NMOS transistor NM1 would receive the external input voltage VIN and output the internal input voltage VINN to the buffer G1.

However, the highest voltage level of the internal input voltage VINN would be restricted by the NMOS transistor NM1 at VDDIO-VthN, where VthN is the threshold voltage of the NMOS transistor NM1. Accordingly, even higher voltage level of the external input voltage VIN (for example, VDDIO) can not be supplied to the buffer G1 directly. Moreover, the conventional input circuit 100 does not operate at very low IO supply voltage VDDIO. To be specific, if the IO supply voltage VDDIO is very low, the internal input voltage VINN can not reach the threshold voltage of the buffer G1.

SUMMARY OF THE INVENTION

The present invention is directed to a high voltage tolerant input circuit capable of operating at extremely low input/output (IO) supply voltage.

The present invention provides an input circuit including a diode, a resistor, a first transistor, a buffer, a bulk voltage generating unit and an enhancing unit. The diode has an anode coupled to a ground voltage, and a cathode receiving an external input voltage. The resistor has a first terminal coupled to the cathode of the diode. The first transistor has a gate terminal receiving a first supply voltage, a first terminal coupled to a second terminal of the resistor, and a second terminal outputting an internal input voltage.

The buffer has an input terminal coupled to the second terminal of the first transistor, and an output terminal outputting an output voltage. The bulk voltage generating unit has a first terminal coupled to the cathode of the diode, a second terminal receiving a control voltage, and a third terminal outputting a first bulk voltage when the external input voltage is less than or equal to the first supply voltage and outputting a second bulk voltage when the external input voltage is greater than the first supply voltage.

The enhancing unit has a first terminal coupled to the second terminal of the resistor, a second terminal coupled to the input terminal of the buffer, a third terminal coupled to the input terminal or the output terminal of the buffer or the second terminal of the resistor, a fourth terminal outputting the control voltage, and a fifth terminal receiving the first bulk voltage or the second bulk voltage. The enhancing unit is used for making the internal input voltage to be the same as the external input voltage when the external input voltage is less than or equal to the first supply voltage, and making the internal input voltage to be kept at a predetermined value which is less than the first supply voltage when the external input voltage is greater than the first supply voltage.

The input circuit of the present invention uses the bulk voltage generating unit and the enhancing unit for making the internal input voltage to be the same as the external input voltage when the external input voltage is less than or equal to the first supply voltage (i.e. IO supply voltage). Moreover, even if the first supply voltage is extremely low, the input circuit of the present can still operate correctly. Accordingly, the input circuit of the present invention can be operated at extremely low IO supply voltage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
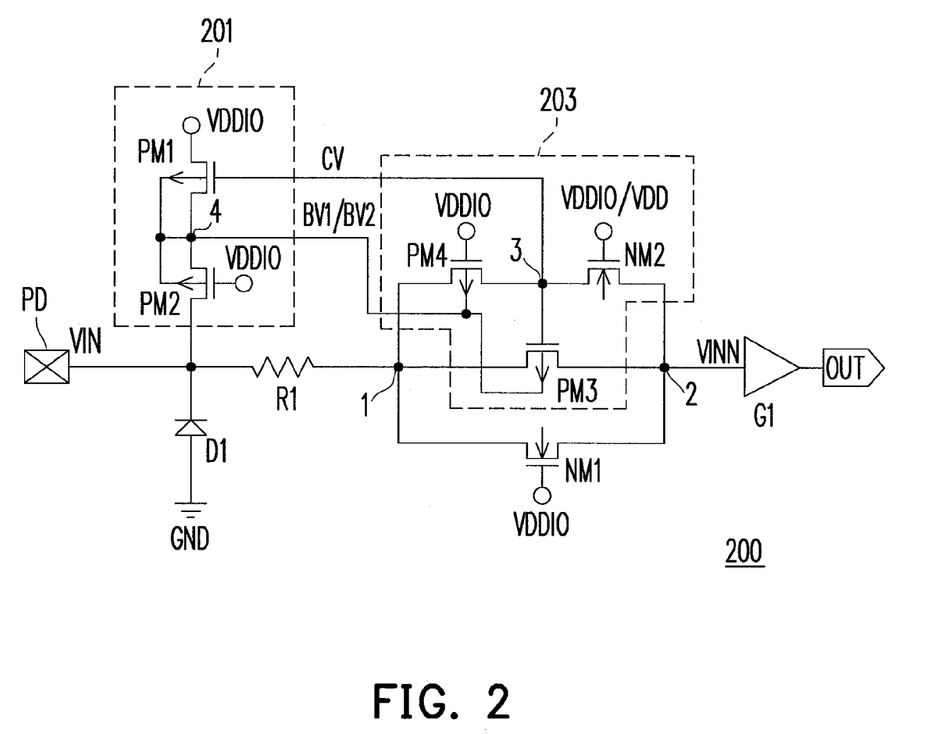
FIG. 2 is a circuit diagram of an input circuit according to an embodiment of the present invention.

FIG. 2 is a circuit diagram of an input circuit 200 according to an embodiment of the present invention. Referring to FIG. 2, the input circuit 200 of the present embodiment includes a diode D1, a resistor R1, a first NMOS transistor NM1, a buffer G1, a bulk voltage generating unit 201 and an enhancing unit 203. In the present embodiment, the diode D1 is an electrostatic discharge (ESD) protection device, and the diode D1 has an anode and a cathode. The anode of the diode D1 is coupled to a ground voltage GND. The cathode of the diode D1 is used for receiving an external input voltage VIN through, for example, a pad PD.

The resistor R1 is used for protecting some internal circuits (not shown) coupled to an output terminal of the buffer G1 by adding a delay and reducing the noise level of the external input voltage VIN. A first terminal of the resistor R1 is coupled to the cathode of the diode D1, and a second of the resistor R1 is coupled to a first terminal of the first NMOS transistor NM1. A gate terminal of the first NMOS transistor NM1 would be biased on a first supply voltage (for example, an input/output (IO) supply voltage; hereinafter "IO supply voltage") VDDIO, while a second terminal of the first NMOS transistor NM1 would output an internal input voltage VINN.

The buffer G1 has an input terminal and an output terminal, wherein the input terminal of the buffer G1 is coupled to the second terminal of the first NMOS transistor NM1 for receiving the internal input voltage VINN, while the output terminal of the buffer G1 would output an output voltage, in response to the internal input voltage VINN, to the above-mentioned internal circuits.

The bulk voltage generating unit 201 has a first through a third terminals, wherein the first terminal of the bulk voltage generating unit 201 is coupled to the cathode of the diode D1; the second terminal of the bulk voltage generating unit 201 is used for receiving a control voltage CV; and the third terminal of the bulk voltage generating unit 201 is used for outputting a first bulk voltage BV1 when the external input voltage VIN is less than or equal to the IO supply voltage VDDIO and outputting a second bulk voltage BV2 when the external input voltage VIN is greater than the IO supply voltage VDDIO.

In the present embodiment, the bulk voltage generating unit 201 includes a first PMOS transistor PM1 and a second PMOS transistor PM2. The first PMOS transistor PM1 has a first and a second terminals, a gate terminal and a bulk terminal, wherein the first terminal of the first PMOS transistor PM1 is used for receiving the IO supply voltage VDDIO; the gate terminal of the first PMOS transistor PM1 is used for receiving the control voltage CV and to be served as the second terminal of the bulk voltage generating unit 201; and the second terminal of the first PMOS transistor PM1 is coupled to the bulk terminal thereof and to be served as the third terminal of the bulk voltage generating unit 201 for outputting the first bulk voltage BV1 or the second bulk voltage BV2.

The second PMOS transistor PM2 has a first and a second terminals, a gate terminal and a bulk terminal, wherein the first terminal of the second PMOS transistor PM2 is coupled to the cathode of the diode D1 and to be served as the first terminal of the bulk voltage generating unit 201; the gate terminal of the second PMOS transistor PM2 is used for receiving the IO supply voltage VDDIO; and the second terminal of the second PMOS transistor PM2 is coupled to the bulk terminal thereof and the second terminal of the first PMOS transistor PM1.

The enhancing unit 203 has a first through a fifth terminals, wherein the first terminal of the enhancing unit 203 is coupled to the second terminal of the resistor R1; the second terminal of the enhancing unit 203 is coupled to the input terminal of the buffer G1; the third terminal of the enhancing unit 203 is coupled to the input terminal of the buffer G1; the fourth terminal of the enhancing unit 203 is used for outputting the control voltage CV; and the fifth terminal of the enhancing unit 203 is used for receiving the first bulk voltage BV1 or the second bulk voltage BV2.

The enhancing unit 203 is used for making the internal input voltage VINN to be the same as the external input voltage VIN when the external input voltage VIN is less than or equal to the IO supply voltage VDDIO, and making the internal input voltage VINN to be kept at a predetermined value which is less than the IO supply voltage VDDIO when the external input voltage VIN is greater than the IO supply voltage VDDIO.

In the present embodiment, the enhancing unit 203 includes a third PMOS transistor PM3, a second NMOS transistor NM2 and a fourth PMOS transistor PM4. The third PMOS transistor PM3 has a first and a second terminals, a gate terminal and a bulk terminal, wherein the first terminal of the third PMOS transistor PM3 is coupled to the second terminal of the resistor R1 and to be served as the first terminal of the enhancing unit 203; and the second terminal of the third PMOS transistor PM3 is coupled to the input terminal of the buffer G1 and to be served as the second terminal of the enhancing unit 203.

The gate terminal of the third PMOS transistor PM3 is coupled to the gate terminal of the first PMOS transistor PM1 and to be served as the fourth terminal of the enhancing unit 203 for outputting the control voltage CV; and the bulk terminal of the third PMOS transistor PM3 is coupled to the second terminal of the first PMOS transistor PM1 and to be served as the fifth terminal of the enhancing unit 203 for receiving the first bulk voltage BV1 or the second bulk voltage BV2.

The second NMOS transistor NM2 has a first and a second terminals and a gate terminal, wherein the gate terminal of the second NMOS transistor NM2 is used for receiving the IO supply voltage VDDIO; the first terminal of the second NMOS transistor NM2 is coupled to the input terminal of the buffer G1 and to be served as the third terminal of the enhancing unit 203; and the second terminal of the second NMOS transistor NM2 is coupled to the gate terminal of the third PMOS transistor PM3.

The fourth PMOS transistor PM4 has a first and a second terminals, a gate terminal and a bulk terminal, wherein the gate terminal of the fourth PMOS transistor PM4 is used for receiving the IO supply voltage VDDIO; the first terminal of the fourth PMOS transistor PM4 is coupled to the gate terminal of the third PMOS transistor PM3; the second terminal of the fourth PMOS transistor PM4 is coupled to the first terminal of the third PMOS transistor PM3; and the bulk terminal of the fourth PMOS transistor PM4 is coupled to the bulk terminal of the third PMOS transistor PM3.

From the above, the bulk voltage generating unit 201 and the enhancing unit 203 make the internal input voltage VINN to be the same as the external input voltage VIN when the external input voltage VIN is less than or equal to the IO supply voltage VDDIO, and the internal input voltage VINN to be kept at a predetermined value which is less than the IO supply voltage VDDIO when the external input voltage VIN is greater than the IO supply voltage VDDIO. Below, the operation of the input circuit 200 in the present invention will be described in detail.

In the present embodiment, when the external input voltage VIN is low (for example, a reference supply voltage VSS), the first and the second NMOS transistors NM1 and NM2 are both turned on, so that the voltage level of the nodes 2 and 3 are the same as the external input voltage VIN, and the voltage level of the node 3 is the above-mentioned control voltage CV. Accordingly, the voltage level of the internal input voltage VINN would be equal to (the same as) the voltage level of the external input voltage VIN, namely, VINN=VIN(=VSS). In this case, the voltage level of the node 4 would be kept at the IO supply voltage VDDIO by the first PMOS transistor PM1, and the voltage level of the node 4 is the above-mentioned first bulk voltage BV1 (VDDIO).

Next, when the external input voltage VIN is asserted from low to high, since the voltage level of the node 3 is low, so that the third PMOS transistor PM3 would be turned on in the beginning. Accordingly, the voltage level of the node 2 would be the same as the voltage level of the node 1, and the voltage level of the node 3 would be kept lower than the voltage levels of the nodes 1 and 2 because of the second NMOS transistor NM2.

Next, when the external input voltage VIN reaches to the IO supply voltage VDDIO, the voltage level of the node 3 would gradually get higher, but since the threshold voltage (VthN) of the second NMOS transistor NM2 would be greater than the absolute value of the threshold voltage (|VthP|) of the third PMOS transistor PM3 because of the body effect of the second NMOS transistor NM2, the third PMOS transistor PM3 would be kept turning on slightly (or shallowly), so that the internal input voltage VINN would be equal to the external input voltage VIN, namely, VINN=VIN(=VDDIO). In this case, the voltage level of the node 4 is still kept at the IO supply voltage VDDIO by the first PMOS transistor PM1.

In accordance with the above cases (i.e. VIN=VSS and VIN=VDDIO), it can be known that the internal input voltage VINN is the same as the external input voltage VIN when the external input voltage VIN is less than or equal to the IO supply voltage VDDIO, so that the buffer G1 would receive the same voltage level as the voltage level of the external input voltage VIN.

However, when the voltage level of the external input voltage VIN is higher than the IO supply voltage VDDIO (for example, VIN>VDDIO+|VthP|), the second and the fourth PMOS transistors PM2 and PM4 would be both turned on, and the first and the third PMOS transistors PM1 and PM3 would be both turned off. In this case, the voltage level of the node 4 would be kept at the voltage level of the external input voltage VIN by the second PMOS transistor PM2, and the voltage level of the node 4 is the above-mentioned second bulk voltage BV2 (VIN), moreover, the internal input voltage VINN would be kept at VDDIO−VthN (i.e. the above-mentioned predetermined value).

Since the voltage level of the internal input voltage VINN would not be influenced by the IO supply voltage VDDIO when the external input voltage VIN is less than or equal to the IO supply voltage VDDIO, the voltage level of the internal input voltage VINN would be the same as the voltage level of the external input voltage VIN. Accordingly, the input circuit 200 can operate at correctly even if the IO supply voltage VDDIO is very/extremely low. In addition, since the internal input voltage VINN would be increased quickly because of the third PMOS transistor PM3, the operation speed of the input circuit 200 is much faster than the conventional input circuit 100 described in Description of the Related Art.

However, in order to further improve the speed operation of the input circuit 200, the IO supply voltage VDDIO originally received by the gate terminal of the second NMOS transistor NM2 can be changed to a second supply voltage (for example, a core supply voltage) VDD which is less than the IO supply voltage VDDIO). As such, the voltage level of the node 3 would be kept even lower, so that the third PMOS transistor PM3 would be deeply turned on. Therefore, the operation speed of the input circuit 200 can be further improved.

In accordance with the spirit of the present invention, several embodiments different from the above embodiment will be described in below.

Figure 3:
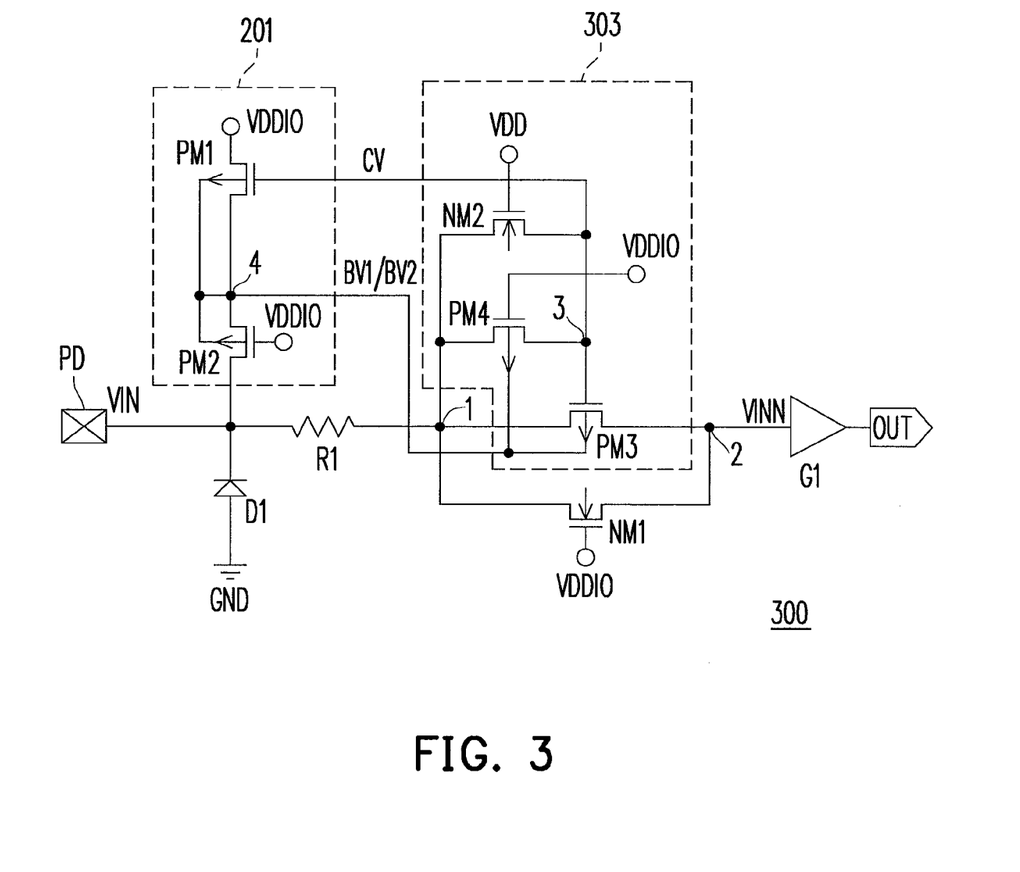
FIG. 3 is a circuit diagram of an input circuit according to another embodiment of the present invention.

FIG. 3 is a circuit diagram of an input circuit 300 according to another embodiment of the present invention. Referring to FIG. 2 and FIG. 3, in the present embodiment, all of components in the input circuit 300 are similar to the input circuit 200. The difference between the input circuit 300 and the input circuit 200 is that the enhancing unit 303 of the input circuit 300 is different from the enhancing unit 203 of the input circuit 200. To be specific, the first terminal of the second NMOS transistor NM2 is coupled to the input terminal of the buffer G1 in the input circuit 200, but the first terminal of the second NMOS transistor NM2 is coupled to the second terminal of the resistor R1 in the input circuit 300.

Moreover, in the input circuit 300, the gate terminal of the second NMOS transistor NM2 is used for receiving the core supply voltage VDD rather than the IO supply voltage VDDIO. Accordingly, the voltage level of the node 3 would be kept lower than VDD-VthN, so that the third PMOS transistor PM3 would be deeply turned on. Therefore, the operation speed of the input circuit 300 can be much faster than or the same as the input circuit 200.

Figure 4:
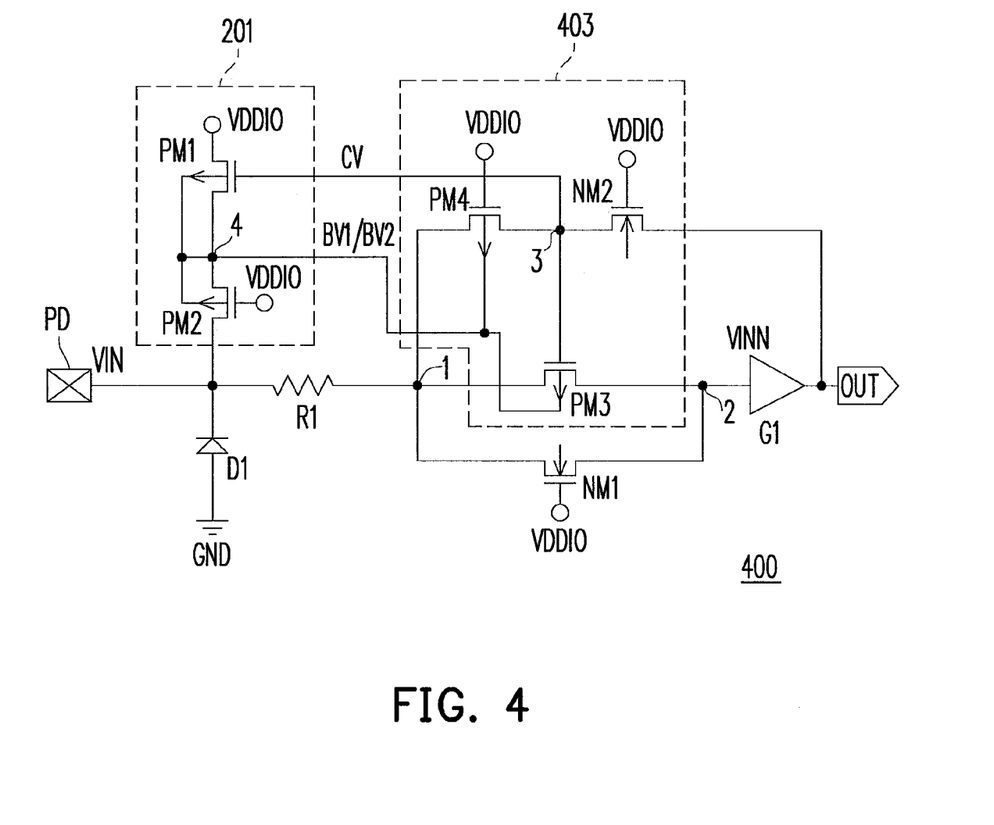
FIG. 4 is a circuit diagram of an input circuit according to another embodiment of the present invention.

FIG. 4 is a circuit diagram of an input circuit 400 according to another embodiment of the present invention. Referring to FIG. 2 and FIG. 4, in the present embodiment, all of components in the input circuit 400 are similar to the input circuit 200. The difference between the input circuit 400 and the input circuit 200 is that the enhancing unit 403 of the input circuit 400 is different from the enhancing unit 203 of the input circuit 200. To be specific, the first terminal of the second NMOS transistor NM2 is coupled to the input terminal of the buffer G1 in the input circuit 200, but the first terminal of the second NMOS transistor NM2 is coupled to the output terminal of the buffer G1 in the input circuit 400.

In the present embodiment, the voltage level of the node 3 would be kept at VSS when the external input voltage VIN is lower than the low level ($V_{IL}$) of the buffer G1. Accordingly, the internal input voltage VINN is the same as the external input voltage VIN, namely, VINN=VIN. Next, when the external input voltage VIN is asserted from low to high, the voltage level of the node 3 would be kept at low (VSS) until the buffer G1 outputs a high output voltage (for example, logic state "1"), and the third PMOS transistor PM3 would be kept deeply turned on during this period.

After the input voltage VIN reaches to the IO supply voltage VDDIO, the output voltage of G1 is kept at the voltage level (VDDIO), and the third PMOS transistor PM3 is still kept turned on slightly because the voltage level of node 3 is kept at VDDIO−VthN which is lower than VDDIO−|Vthp| where VthN is the threshold voltage of the second NMOS transistor NM2 and Vthp is the threshold voltage of the third PMOS transistor PM3, because of the body effect of the second NMOS transistor NM2, the voltage level of the internal input voltage VINN (node 2) would be kept at logic state "1", and the output terminal of the buffer G1 would also be kept at logic state "1". Moreover, when the external input voltage VIN is asserted from high to low, the voltage level of the internal input voltage VINN would be pulled down to the logic state "0" through the first NMOS transistor NM1, so that the buffer G1 would output a low output voltage (VSS). From the above, it can be know that the efficiency of the input circuit 400 also can be similar to the input circuit 200.

Figure 5:
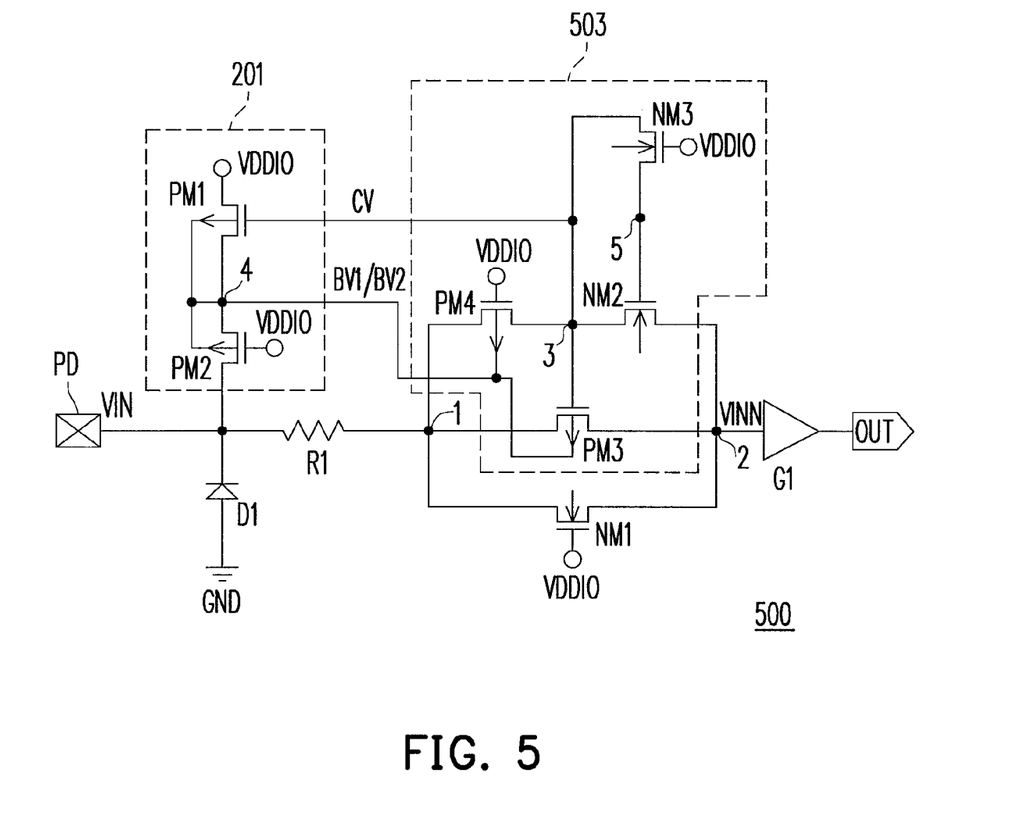
FIG. 5 is a circuit diagram of an input circuit according to another embodiment of the present invention.

FIG. 5 is a circuit diagram of an input circuit 500 according to another embodiment of the present invention. Referring to FIG. 2 and FIG. 5, in the present embodiment, all of components in the input circuit 500 are substantially similar to the input circuit 200. The difference between the input circuit 500 and the input circuit 200 is that the enhancing unit 503 of the input circuit 500 is different from the enhancing unit 203 of the input circuit 200. To be specific, the gate terminal of the second NMOS transistor NM2 would directly receive the IO supply voltage VDDIO in the input circuit 200, but the gate terminal of the second NMOS transistor NM2 would receive the IO supply voltage VDDIO through a third NMOS transistor NM3 in the input circuit 500.

In the input circuit 500, the third NMOS transistor NM3 has a first and a second transistors and a gate terminal, wherein the gate terminal of the third NMOS transistor NM3 is used for receiving the IO supply voltage VDDIO; the first terminal of the third NMOS transistor NM3 is coupled to the gate terminal of the third PMOS transistor PM3; and the second terminal of the third NMOS transistor NM3 is coupled to the gate terminal of the second NMOS transistor NM2.

In the present embodiment, when the input voltage VIN is low (VSS), the voltage levels of the nodes 3 and 5 are set around the threshold voltage (VthN) of the second NMOS transistor NM2. Until the input voltage VIN becomes higher than VDDIO+VthP, the voltage of node 3 is kept lower than VthN where VthP is the threshold voltage of the fourth PMOS PM4. Since the voltage level of the gate terminal of the second NMOS transistor NM2 is set to low (VthN), the third PMOS transistor PM3 would be deeply turning on, so that the resistance of the third PMOS transistor PM3 would be kept lower. Therefore, the operation speed of the input circuit 500 would be much faster than or the same as the input circuit 200. Besides, since no need of different supply voltages (i.e. VDDIO and VDD) in the input circuit 500, so that the input circuit 500 is more easily implemented than the input circuit 200.

Figure 6:
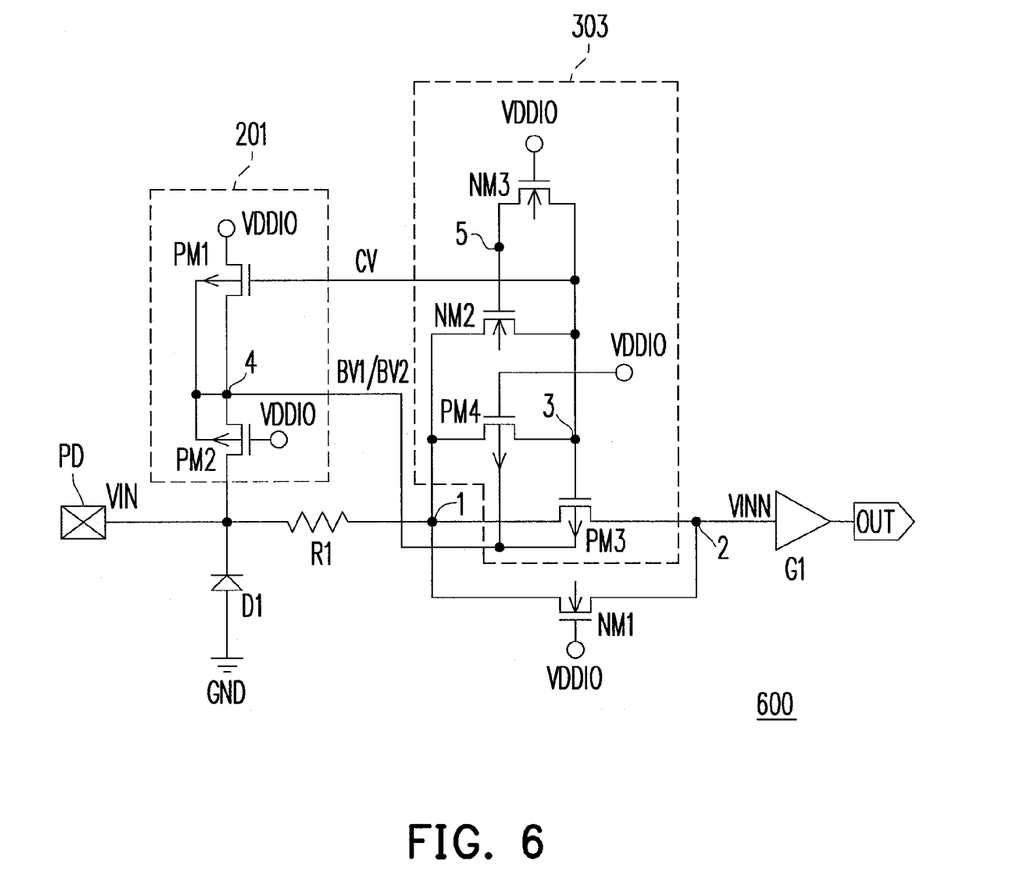
FIG. 6 is a circuit diagram of an input circuit according to another embodiment of the present invention.

FIG. 6 is a circuit diagram of an input circuit 600 according to another embodiment of the present invention. Referring to FIG. 3 and FIG. 6, in the present embodiment, all of components in the input circuit 600 are substantially similar to the input circuit 300. The difference between the input circuit 600 and the input circuit 300 is that the enhancing unit 603 of the input circuit 600 is different from the enhancing unit 303 of the input circuit 300. To be specific, the gate terminal of the second NMOS transistor NM2 would directly receive the core supply voltage VDD in the input circuit 300, but the gate terminal of the second NMOS transistor NM2 would be changed to receive the IO supply voltage VDDIO through a third NMOS transistor NM3 in the input circuit 600.

In the input circuit 600, the third NMOS transistor NM3 has a first and a second transistors and a gate terminal, wherein the gate terminal of the third NMOS transistor NM3 is used for receiving the IO supply voltage VDDIO; the first terminal of the third NMOS transistor NM3 is coupled to the gate terminal of the third PMOS transistor PM3; and the second terminal of the third NMOS transistor NM3 is coupled to the gate terminal of the second NMOS transistor NM2.

In the present embodiment, when the input voltage VIN is low (VSS), the voltage levels of the nodes 3 and 5 are set around the threshold voltage (VthN) of the second NMOS transistor NM2. Until the input voltage VIN becomes higher than VDDIO+VthP, the voltage of node 3 is kept lower than VthN where VthP is the threshold voltage of the fourth PMOS PM4. Since the voltage level of the gate terminal of the second NMOS transistor NM2 is set to low, the third PMOS transistor PM3 would be deeply turning on, so that the resistance of the third PMOS transistor PM3 would be kept lower. Therefore, the operation speed of the input circuit 600 would be much faster than the input circuit 300. Besides, since no need of different supply voltages (i.e. VDDIO and VDD) in the input circuit 600, so that the input circuit 600 is more easily implemented than the input circuit 300.

Figure 7:
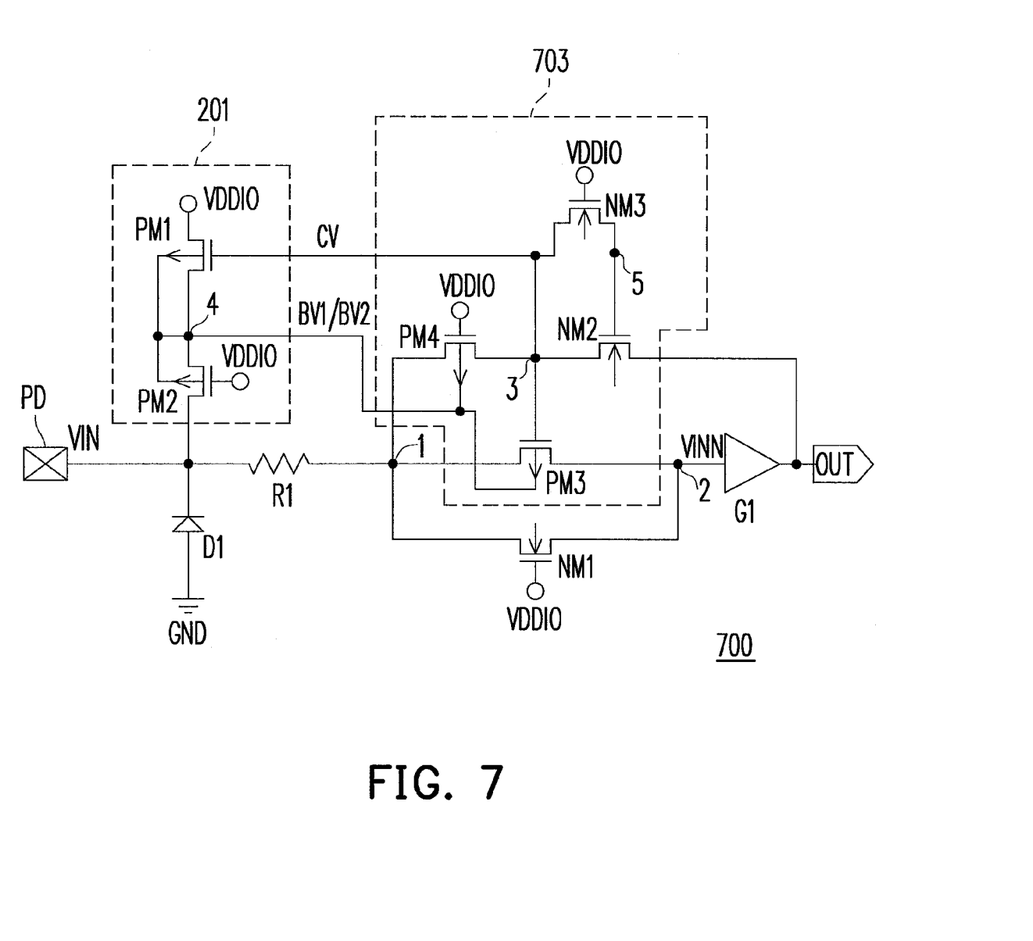
FIG. 7 is a circuit diagram of an input circuit according to another embodiment of the present invention.

FIG. 7 is a circuit diagram of an input circuit 700 according to another embodiment of the present invention. Referring to FIG. 4 and FIG. 7, in the present embodiment, all of components in the input circuit 700 are substantially similar to the input circuit 400. The difference between the input circuit 700 and the input circuit 400 is that the enhancing unit 703 of the input circuit 700 is different from the enhancing unit 403 of the input circuit 400. To be specific, the gate terminal of the second NMOS transistor NM2 would directly receive the IO supply voltage VDDIO in the input circuit 400, but the gate terminal of the second NMOS transistor NM2 would receive the IO supply voltage VDDIO through a third NMOS transistor NM3 in the input circuit 700.

In the input circuit 700, the third NMOS transistor NM3 has a first and a second transistors and a gate terminal, wherein the gate terminal of the third NMOS transistor NM3 is used for receiving the IO supply voltage VDDIO; the first terminal of the third NMOS transistor NM3 is coupled to the gate terminal of the third PMOS transistor PM3; and the second terminal of the third NMOS transistor NM3 is coupled to the gate terminal of the second NMOS transistor NM2.

In the present embodiment, when the input voltage VIN is low (VSS), the voltage levels of the nodes 3 and 5 are set around the threshold voltage (VthN) of the second NMOS transistor NM2. Until the input voltage VIN becomes higher than VDDIO+VthP, the voltage of node 3 is kept lower than VthN where VthP is the threshold voltage of the fourth PMOS PM4. Since the voltage level of the gate terminal of the second NMOS transistor NM2 is set to low, the third PMOS transistor PM3 would be deeply turning on, so that the resistance of the third PMOS transistor PM3 would be kept lower. Therefore, the operation speed of the input circuit 700 would be much faster than the input circuit 400.

In summary, the input circuit of the present invention uses the bulk voltage generating unit and the enhancing unit for making the internal input voltage to be the same as the external input voltage when the external input voltage is less than or equal to the first supply voltage (i.e. IO supply voltage). Moreover, even if the first supply voltage is extremely low, the input circuit of the present can still operate correctly. Accordingly, the input circuit of the present invention can be operated at extremely low IO supply voltage. Besides, the operation speed of all input circuits of the present invention is much faster than the conventional input circuit.

It will be apparent to those skills in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An input circuit, comprising:
   a diode, having an anode coupled to a ground voltage, and a cathode receiving an external input voltage;
   a resistor, having a first terminal coupled to the cathode;
   a first transistor, having a gate terminal receiving a first supply voltage, a first terminal coupled to a second terminal of the resistor, and a second terminal outputting an internal input voltage;
   a buffer, having an input terminal coupled to the second terminal of the first transistor, and an output terminal outputting an output voltage;
   a bulk voltage generating unit, having a first terminal coupled to the cathode, a second terminal receiving a control voltage, and a third terminal outputting a first bulk voltage when the external input voltage is less than or equal to the first supply voltage and outputting a second bulk voltage when the external input voltage is greater than the first supply voltage; and
   an enhancing unit, having a first terminal coupled to the second terminal of the resistor, a second terminal coupled to the input terminal of the buffer, a third terminal coupled to the input terminal or the output terminal of the buffer or the second terminal of the resistor, a fourth terminal outputting the control voltage, and a fifth terminal receiving the first bulk voltage or the second bulk voltage, for making the internal input voltage to be the same as the external input voltage when the external input voltage is less than or equal to the first supply voltage, and making the internal input voltage to be kept at a predetermined value which is less than the first supply voltage when the external input voltage is greater than the first supply voltage.

2. The input circuit according to claim 1, wherein the first transistor is an NMOS transistor.

3. The input circuit according to claim 2, wherein the bulk voltage generating unit comprises:
   a second transistor, having a first terminal receiving the first supply voltage, a gate terminal receiving the control voltage and to be served as the second terminal of the bulk voltage generating unit, and a second terminal coupled to a bulk terminal thereof and to be served as the third terminal of the bulk voltage generating unit; and
   a third transistor, having a first terminal coupled to the cathode and to be served as the first terminal of the bulk voltage generating unit, a gate terminal receiving the first supply voltage, and a second terminal coupled to a bulk terminal thereof and the second terminal of the second transistor.

4. The input circuit according to claim 3, wherein the second transistor and the third transistor are PMOS transistors.

5. The input circuit according to claim 4, wherein the enhancing unit comprises:
   a fourth transistor, having a first terminal coupled to the second terminal of the resistor and to be served as the first terminal of the enhancing unit, a second terminal coupled to the input terminal of the buffer and to be served as the second terminal of the enhancing unit, a gate terminal coupled to the gate terminal of the second transistor and to be served as the fourth terminal of the enhancing unit, and a bulk terminal coupled to the second terminal of the second transistor and to be served as the fifth terminal of the enhancing unit.

6. The input circuit according to claim 5, wherein the enhancing unit further comprises:
   a fifth transistor, having a gate terminal receiving the first supply voltage or a second supply voltage which is less than the first supply voltage, a first terminal coupled to the input terminal of the buffer and to be served as the third terminal of the enhancing unit, and a second terminal coupled to the gate terminal of the fourth transistor; and
   a sixth transistor, having a gate terminal receiving the first supply voltage, a first terminal coupled to the gate terminal of the fourth transistor, a second terminal coupled to the first terminal of the fourth transistor, and a bulk terminal coupled to the bulk terminal of the fourth transistor.

7. The input circuit according to claim 6, wherein the fourth and sixth transistors are PMOS transistors and the fifth transistor is an NMOS transistor.

8. The input circuit according to claim 7, wherein a threshold voltage of the fifth transistor is greater than an absolute value of a threshold voltage of the fourth transistor.

9. The input circuit according to claim 6, wherein the first supply voltage is an input/output (IO) supply voltage and the second supply voltage is a core supply voltage for an internal (core) circuit.

10. The input circuit according to claim 5, wherein the enhancing unit further comprises:
    a fifth transistor, having a gate terminal receiving the first supply voltage, a first terminal coupled to the output terminal of the buffer and to be served as the third terminal of the enhancing unit, and a second terminal coupled to the gate terminal of the fourth transistor; and
    a sixth transistor, having a gate terminal receiving the first supply voltage, a first terminal coupled to the gate terminal of the fourth transistor, a second terminal coupled to the first terminal of the fourth transistor, and a bulk terminal coupled to the bulk terminal of the fourth transistor.

11. The input circuit according to claim 10, wherein the fourth and sixth transistors are PMOS transistors and the fifth transistor is an NMOS transistor.

12. The input circuit according to claim 11, wherein a threshold voltage of the fifth transistor is greater than an absolute value of a threshold voltage of the fourth transistor.

13. The input circuit according to claim 10, wherein the first supply voltage is an input/output (IO) supply voltage.

14. The input circuit according to claim 5, wherein the enhancing unit further comprises:
    a fifth transistor, having a gate terminal receiving a second supply voltage which is less than the first supply voltage, a first terminal coupled to the second terminal of the resistor and to be served as the third terminal of the enhancing unit, and a second terminal coupled to the gate terminal of the fourth transistor; and
    a sixth transistor, having a gate terminal receiving the first supply voltage, a first terminal coupled to the gate terminal of the fourth transistor, a second terminal coupled to the first terminal of the fourth transistor, and a bulk terminal coupled to the bulk terminal of the fourth transistor.

15. The input circuit according to claim 14, wherein the fourth and sixth transistors are PMOS transistors and the fifth transistor is an NMOS transistor.

16. The input circuit according to claim 15, wherein a threshold voltage of the fifth transistor is greater than an absolute value of a threshold voltage of the fourth transistor.

17. The input circuit according to claim 14, wherein the first supply voltage is an input/output (IO) supply voltage and the second supply voltage is a core supply voltage for an internal (core) circuit.

18. The input circuit according to claim 5, wherein the enhancing unit further comprises:
    a fifth transistor, having a gate terminal receiving the first supply voltage, and a first terminal coupled to the gate terminal of the fourth transistor;
    a sixth transistor, having a gate terminal coupled to a second terminal of the fifth transistor, a first terminal coupled to the input terminal of the buffer and to be served as the third terminal of the enhancing unit, and a second terminal coupled to the gate terminal of the fourth transistor; and
    a seventh transistor, having a gate terminal receiving the first supply voltage, a first terminal coupled to the gate terminal of the fourth transistor, a second terminal coupled to the first terminal of the fourth transistor, and a bulk terminal coupled to the bulk terminal of the fourth transistor.

19. The input circuit according to claim 18, wherein the fourth and the seventh transistors are PMOS transistors and the fifth and the sixth transistors are NMOS transistors.

20. The input circuit according to claim 19, wherein a threshold voltage of the sixth transistor is greater than an absolute value of a threshold voltage of the fourth transistor.

21. The input circuit according to claim 18, wherein the first supply voltage is an input/output (IO) supply voltage.

22. The input circuit according to claim 5, wherein the enhancing unit further comprises:
    a fifth transistor, having a gate terminal receiving the first supply voltage, and a first terminal coupled to the gate terminal of the fourth transistor;

a sixth transistor, having a gate terminal coupled to a second terminal of the fifth transistor, a first terminal coupled to the second terminal of the resistor and to be served as the third terminal of the enhancing unit, and a second terminal coupled to the gate terminal of the fourth transistor; and a seventh transistor, having a gate terminal receiving the first supply voltage, a first terminal coupled to the gate terminal of the fourth transistor, a second terminal coupled to the first terminal of the fourth transistor, and a bulk terminal coupled to the bulk terminal of the fourth transistor.

23. The input circuit according to claim 22, wherein the fourth and seventh transistors are PMOS transistors and the fifth and the sixth transistors are NMOS transistors.

24. The input circuit according to claim 23, wherein a threshold voltage of the sixth transistor is greater than an absolute value of a threshold voltage of the fourth transistor.

25. The input circuit according to claim 22, wherein the first supply voltage is an input/output (IO) supply voltage.

26. The input circuit according to claim 5, wherein the enhancing unit further comprises:

a fifth transistor, having a gate terminal receiving the first supply voltage, and a first terminal coupled to the gate terminal of the fourth transistor;

a sixth transistor, having a gate terminal coupled to a second terminal of the fifth transistor, a first terminal coupled to the output terminal of the buffer and to be served as the third terminal of the enhancing unit, and a second terminal coupled to the gate terminal of the fourth transistor; and a seventh transistor, having a gate terminal receiving the first supply voltage, a first terminal coupled to the gate terminal of the fourth transistor, a second terminal coupled to the first terminal of the fourth transistor, and a bulk terminal coupled to the bulk terminal of the fourth transistor.

27. The input circuit according to claim 26, wherein the fourth and seventh transistors are PMOS transistors and the fifth and the sixth transistors are NMOS transistors.

28. The input circuit according to claim 27, wherein a threshold voltage of the sixth transistor is greater than an absolute value of a threshold voltage of the fourth transistor.

29. The input circuit according to claim 26, wherein the first supply voltage is an input/output (IO) supply voltage.

* * * * *